United States Patent
Diab et al.

(10) Patent No.: US 8,214,721 B2
(45) Date of Patent: Jul. 3, 2012

(54) SYSTEM AND METHOD FOR ACHIEVING HIGHER DATA RATES IN PHYSICAL LAYER DEVICES

(75) Inventors: Wael William Diab, San Francisco, CA (US); Scott Powell, Alisa Viejo, CA (US); Yong Kim, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 446 days.

(21) Appl. No.: 12/569,543

(22) Filed: Sep. 29, 2009

(65) Prior Publication Data

US 2011/0010609 A1    Jan. 13, 2011

Related U.S. Application Data

(60) Provisional application No. 61/223,820, filed on Jul. 8, 2009.

(51) Int. Cl.
*H03M 13/00* (2006.01)
(52) U.S. Cl. ........ 714/774; 714/757; 714/746; 714/752; 714/776
(58) Field of Classification Search .................. None
See application file for complete search history.

(56) References Cited

U.S. PATENT DOCUMENTS

| | | | | |
|---|---|---|---|---|
| 6,851,086 | B2 * | 2/2005 | Szymanski | 714/781 |
| 7,720,136 | B2 * | 5/2010 | Friedman et al. | 375/220 |
| 7,782,852 | B2 * | 8/2010 | Tellado et al. | 370/391 |
| 8,065,598 | B1 * | 11/2011 | Gunnam et al. | 714/800 |
| 2002/0120902 | A1 * | 8/2002 | Brown | 714/776 |
| 2006/0218459 | A1 * | 9/2006 | Hedberg | 714/752 |
| 2008/0288846 | A1 * | 11/2008 | Kyung et al. | 714/752 |
| 2009/0122874 | A1 * | 5/2009 | Kolze et al. | 375/240.24 |
| 2009/0259915 | A1 * | 10/2009 | Livshitz et al. | 714/758 |
| 2010/0077276 | A1 * | 3/2010 | Okamura et al. | 714/752 |
| 2010/0125764 | A1 * | 5/2010 | Kose | 714/704 |
| 2012/0033714 | A1 * | 2/2012 | Lakkis et al. | 375/147 |

* cited by examiner

*Primary Examiner* — John Trimmings
(74) *Attorney, Agent, or Firm* — Duane S. Kobayashi

(57) ABSTRACT

A system and method for achieving higher data rates in physical layer devices. Costs imposed by large data rate increases represented by generational increases in Ethernet standards activities are avoided through physical layer device modifications that enable marginal increases in data bandwidth. Building-block reuse can be promoted through the selective use of clocking rate increase, increase in coding efficiency, and bit reuse.

19 Claims, 4 Drawing Sheets

SYSTEM AND METHOD FOR ACHIEVING HIGHER DATA RATES IN PHYSICAL LAYER DEVICES

This application claims priority to provisional application No. 61/223,820, filed Jul. 8, 2009, which is incorporated by reference herein, in its entirety, for all purposes.

BACKGROUND

1. Field of the Invention

The present invention relates generally to Ethernet systems and methods and, more particularly, to a system and method for achieving higher data rates in physical layer devices.

2. Introduction

Ethernet devices continue to evolve in capability as the incremental increases in the standardized transmission rates have progressed by orders of magnitude. In a relatively short period of time, transmission rates for standardized Ethernet devices have progressed from 10 Mbit/s to 100 Mbit/s, from 100 Mbit/s to 1 Gbit/s, and more recently, from 1 Gbit/s to 10 Gbit/s. Efforts are ongoing to identify the next transmission rate that is to be adopted as the next standard of Ethernet performance. Whether 40 Gbit/s or 100 Gbit/s, the next transmission rate will be significantly higher than 10 Gbit/s.

The significant advances in the standardized transmission rates has provided substantial benefits in increasing the available bandwidth in an Ethernet network. These large increases in available bandwidth have enabled significant changes in the applications that can be supported across various types of networks. As the cost of bandwidth has decreased, and so also have the performance barriers that have hindered certain types of applications.

Notwithstanding the substantial benefits that have been realized by the large increases in transmission rates, those same large increases in transmission rates can likewise create other cost barriers that can hinder the deployment of some applications. Balancing the benefit of the increased transmission rate are the implementation costs such as system complexity, physical plant improvements (e.g., cabling), increased power consumed, etc. These implementation costs may be justified in those instances where the full benefits of the increased transmission rate are being realized. Where the full benefits of the increased transmission rate are not being realized, however, the implementation costs can dominate and other potential solutions are needed.

SUMMARY

A system and/or method for achieving higher data rates in physical layer devices, substantially as shown in and/or described in connection with at least one of the figures, as set forth more completely in the claims.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
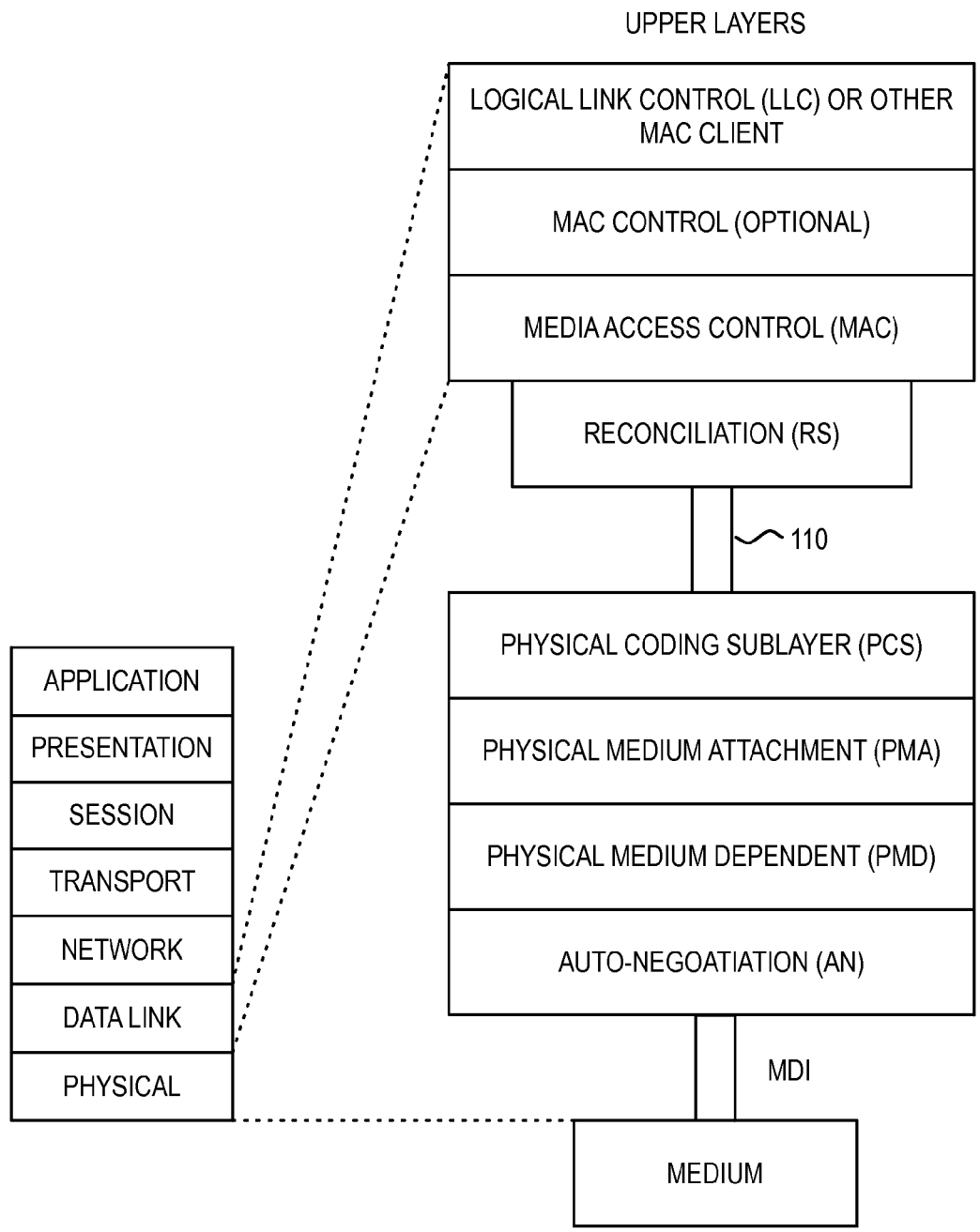
FIG. 1 illustrates an OSI layering diagram.

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

Ethernet has become an increasingly pervasive technology that has been applied in various contexts, including twisted pair, backplane, and optical applications. The inherent simplicity of Ethernet has enabled application of the technology to various mediums, various speeds, and various distances. These features have enabled Ethernet to become a viable technology option that spans high-speed laboratory networks, commercial networks, and increasingly to consumer networks.

As Ethernet is increasingly deployed, the economies of scale have become more attractive. Maintaining the Ethernet solution as a simple, low-cost solution is therefore a key factor in facilitating in continuing and expanding its adoption.

As noted, Ethernet transmission rates have seen rapid advancement with order-of-magnitude increases in transmission rates being made available in new generations of Ethernet devices. These substantial increases in transmission rates come with certain implementation costs, however, as increases in system complexity, increases in costs for physical plant improvements (e.g., cabling), increases in power consumed, etc. have balanced the benefit of the increase in transmission rate.

To illustrate these implementation costs, consider the example of the transmission of high-definition television (HDTV) signals. Unlike initial generations of HDTVs made available to consumers, current HDTVs support the full 1080P HDTV standard. Transmission of an uncompressed 1080P HDTV signal can require a link transmission rate of approximately 12 Gbit/s. This 12 Gbit/s transmission rate is marginally greater than the current capacity of today's 10 Gbit/s Ethernet devices and yet significantly less than the capacity of next generation 40 Gbit/s or 100 Gbit/s Ethernet devices.

Various options are available that can address this deficiency. A first option is to compress the 1080P HDTV signal to facilitate its transmission on a lower capacity link. This solution represents a conventional approach and also serves to demonstrate the obvious limitations of the currently-deployed consumer network. To date, consumer networks have only begun to deploy 1 Gbit/s Ethernet devices, and have not yet come close to needing a deployment of 10 Gbit/s devices. Transmission capacity in the consumer network will continually advance, however, as current 1 Gbit/s Ethernet links give way to 10 Gbit/s Ethernet links.

Even when the newest generation of 10 Gbit/s Ethernet devices begin their deployment in consumer networks, compression of such 1080P HDTV signals would still be required. This scenario is clearly deficient when considering the current capability of HDTVs to display uncompressed 1080P HDTV signals.

A second option for transmitting the uncompressed 1080P HDTV signal would be to use the next generation of Ethernet devices. While not yet defined, this next generation of Ethernet devices may potentially target transmission rates of 40 Gbit/s or 100 Gbit/s. The pace of technological development dictates that such Ethernet devices are already on the near-term horizon. While the bandwidth increase from 10 Gbit/s to 40 Gbit/s or 100 Gbit/s would easily facilitate the transmission of a 12 Gbit/s uncompressed 1080P HDTV signal, the costs of such an advanced solution will likely be unjustified in view of the implementation costs. In other words, even when next generation 40 Gbit/s or 100 Gbit/s devices are defined, the development of a low-cost interface based on such technology will take time.

As noted, a first example implementation cost is the new cabling, connectors and magnetics that would be required. To facilitate the higher transmission rates, tighter constraints on the quality of the cabling, connectors and magnetics would dictate the replacement of existing infrastructure.

A second example implementation cost is the increased energy costs that would be incurred in supporting the higher transmission rate. Energy efficiency is a key consideration in Ethernet devices as energy costs continue to escalate in a trend that has accelerated in recent years. For that reason, the IT infrastructure has drawn increasing scrutiny as a potential area where energy costs can be reduced. In light of current industry trends, the energy efficiency issues presented by the deployment of a 40 or 100 Gbit/s link to transport a 12 Gbit/s data stream are cause for significant concern.

It is a feature of the present invention that these implementation costs along with other development costs incurred in the development of next-generation components can be reduced through a solution that obviates the need to deploy transmission equipment that takes the large leap to the next transmission rate level. One of the goals of such a solution is the reuse of architectures and building blocks in existing Ethernet devices to extend the transmission rate to capture the marginal increase in transmission capacity needed.

For example, as applied to the HDTV scenario noted above, the principles of the present invention can be used to extend the transmission capacity of 10 Gbit/s systems and components to cover a 12 Gbit/s HDTV stream. A benefit of such an extension is that it would not require the large implementation costs imposed by the large leap to the next transmission rate level at 40 Gbit/s or 100 Gbit/s.

To illustrate the features of the present invention, reference is first made to FIG. 1, which illustrates the ISO Open System Interconnection (OSI) reference model and its mapping to the IEEE 802.3 layering.

As illustrated, the physical layer (often referred to as the PHY) includes a physical coding sublayer (PCS), a physical medium attachment (PMA), physical media dependent (PMD), and auto-negotiation (AN). It should be noted that some of these layers (e.g., auto-negotiation) are optional for some PHY types, and that some PHY types do no use all of the sub-layers. As illustrated, the PCS is coupled to a reconciliation sublayer (RS), which provides a signal mapping between interface 110 and the MAC layer. In various examples, interface 110 can be based on an Attachment Unit Interface (AUI), media independent interface (MII), serial MII (SMII), reduced MII, (RMII), gigabit MII (GMII), reduced GMII (RGMII), serial GMII (SGMII), quad serial gigabit MII (QSGMII), 10 gigabit MII (XGMII), SXGMII, XFI, 10-Gbps AUI (XAUI), or the like. In an MII example, the PCS is generally responsible for encoding/decoding to/from five-bit code-groups (4B/5B) for communication with the underlying PMA. In a GMII example, the PCS is generally responsible for encoding/decoding GMII octets to/from ten-bit code-groups (8B/10B) for communication with the underlying PMA. In an XGMII example, the PCS is generally responsible for encoding/decoding XGMII 64-bit data to/from 66-bit code-groups (64B/66B) for communication with the underlying PMA. In various embodiments, one or more parts of the PHY can be internal or external to the MAC. In one embodiment, an extender such as the XAUI extender sublayer (XGXS) or XFI can be used between the MAC/PHY.

In general, the PMA abstracts the PCS from the physical medium. Accordingly, the PCS can be unaware of the type of medium. The primary functions of the PMA include mapping of transmit and receive code-groups between the PCS and PMA, serialization/de-serialization of code-groups for transmission/reception on the underlying PMD, recovery of clock from the coded data (e.g., 4B/5B, 8B/10B, 64B/66B, etc.) supplied by the PMD, and mapping of transmit and receive bits between the PMA and PMD.

The PMD is generally responsible for generating electrical or optical signals depending on the nature of the physical medium connected. PMD signals are sent to the medium dependent interface (MDI), which is the actual medium connected, including connectors, for the various media supported.

An example architecture of a 10 Gbit/s physical layer device (PHY) is now described with reference to FIG. 2. As illustrated, the PHY transceiver includes MAC I/F 210, which can be designed to support XGMII or XAUI interfaces, as an example. On the transmission side, the PHY transceiver can include PCS encode 221, Scrambler 222, Low Density Parity Check (LDPC) 223, 128 Double Square (DSQ) Mapper 224, Pre-Coder 225, Digital-Analog Converter (DAC) 226, and Hybrid 240. Correspondingly, on the receiver side, signals received at Hybrid 240, are processed by Variable Gain Amplifier (VGA) 237, Analog-Digital Converter (ADC) 236, Crosstalk (Xtalk) Canceller and Equalizer 235, 128 DSQ Soft Decisions 234, LDPC Decode 233, Descrambler 232, and PCS decode 231, which delivers signals to MAC I/F 210.

Figure 2:
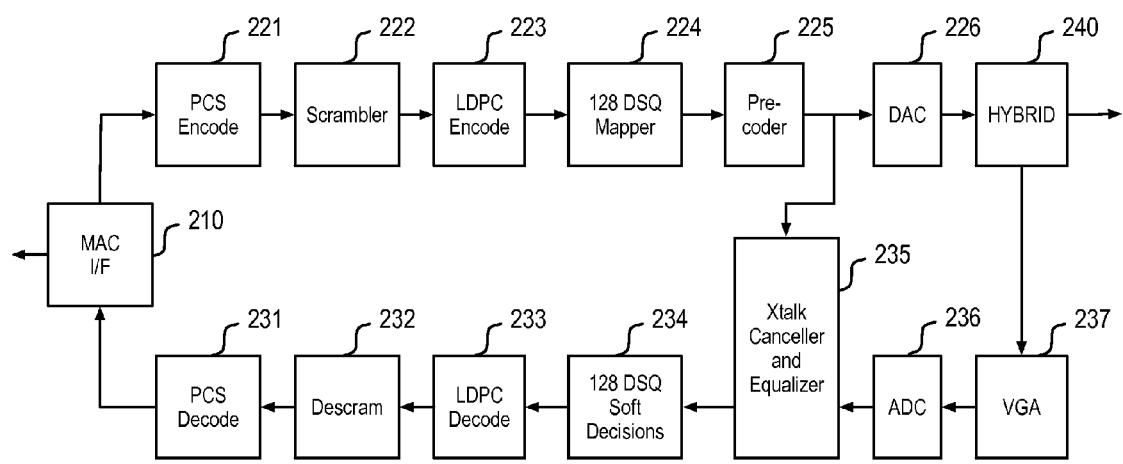
FIG. 2 illustrates an example of an Ethernet physical layer device.

In the present invention, it is desired to reuse the building blocks of an existing PHY transceiver, such as that illustrated in FIG. 2, to extend the transmission capacity of the existing PHY transceiver. This building-block reuse can provide the marginal increase in transmission capacity that can obviate the need to incur the large incremental expenses of transitioning to the next standardized transmission rate such as 40 Gbit/s or 100 Gbit/s. In one embodiment, this increase in PHY transmission capacity can be designed to work with a MAC that also has an increased transmission capacity. In another embodiment, the increase in PHY transmission capacity can be designed to work with a standard MAC with the use of deference.

One technique that can increase the transmission capacity while reusing existing building blocks is an increase in the clocking rate of the PHY transceiver. In this technique, the processing of the various building blocks would remain the same, albeit done at a marginally faster rate. For example, the clocking rate of the PHY transceiver can be increased by 10-20% to increase the transmission capacity. Significantly, this increase in transmission capacity through an increase in the clocking rate would not require a replacement of infrastructure components. Moreover, while the increase in clocking rate would marginally increase the energy consumed, this marginal increase would be in proportion to the increase in transmission bandwidth. The cost-benefit impact would therefore be limited.

A second technique that can increase the transmission capacity is the change in the coding efficiency. As the signaling on the link would remain the same even with the coding changes, building-block reuse is again promoted. In the example of FIG. 2, the coding efficiency can be increased through the modification of PCS encode 221 and PCS decode 231. Consider, for example, a PCS encode/decode function that uses a 8B/10B coding scheme. Coding efficiency can be increased by modifying the 8B/10B coding/decoding scheme to a more efficient 64B/65B or 64B/66B coding/decoding scheme. Significantly, the increase in the efficiency of the coding/decoding scheme, produces a corresponding increase in the true bandwidth of the link.

A third technique that can increase the transmission capacity is the reuse of parity or error-correction bits. Here, parity bits can be represented by cyclic redundancy check (CRC) bits, which are designed to protect blocks of data (i.e., frames), while error-correction bits can be represented by LDPC check bits, which provide an error-correcting code. In the present invention, tradeoffs can be made between the relative number of data bits, parity bits, and error-correction bits to thereby increase the effective data bandwidth.

For example, a tradeoff can be made such that the number of data and CRC bits are increased, while the number of LDPC bits are decreased. In one example, the LDPC bits can be removed altogether to increase the number of data bits. In general, the increase in the number of data bits would reflect an increase in the available bandwidth. The decrease in the number of LDPC bits, on the other hand, would reflect an increase in the number of errors as well as a lowering of latency on the link. The cost-benefit of this tradeoff could be compelling. The increase in bandwidth could obviate the need to make the leap to the next standardized bandwidth, while the decrease in data integrity could be acceptable for a consumer-grade application (e.g., low impact of a dropped HDTV frame).

To illustrate these tradeoffs consider an example of an LDPC (1723, 2048) encoding performed by LDPC encode module 223. A 10GBASE-T PHY receives data from MAC I/F 210 (e.g., XGMII). PCS encode 221 can be designed to implement a 64/65 coding, which thereby generates 65-bit code groups. These 65-bit code groups can then be assembled in a group of 50 65-bit blocks. Adding 8 CRC check bits would yield a CRC-checked payload of (50×65)+8=3258 bits.

A single auxiliary channel bit can be added to obtain a block of 3259 bits. This set of 3259 bits can then be divided into 3×512 bit groups plus an additional 1723 bits. The 3×512 bits can remain uncoded, while the 1723 bits are encoded by an LDPC (1723, 2048) encoder. The LDPC (1723, 2048) encoder adds 325 LDPC error correction bits to the 1723 bits to form an LDPC codeword of 2048 coded bits. In combination, the 3×512 uncoded bits and the 2048 (i.e., 4×512) coded bits can finally be arranged in a frame of 7×512 bits. The 7×512 bits can then be mapped by 128 DSQ mapper 224 into symbols selected from the DSQ128 constellation.

Figure 3:
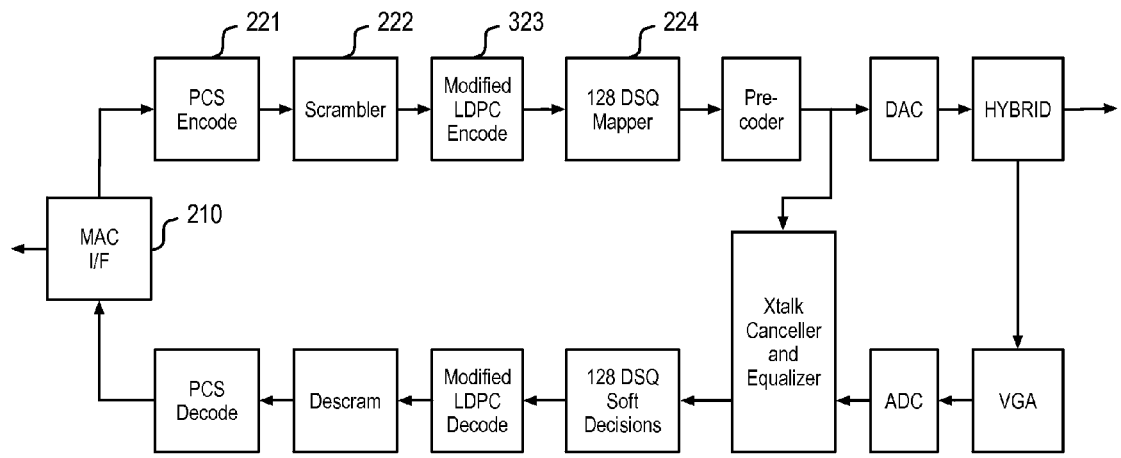
FIG. 3 illustrates an example of building-block reuse in an Ethernet physical layer device.

In the present invention, a modified LDPC encode module can be produced that is designed to function with building block reuse. FIG. 3 illustrates an example of such building block reuse. As illustrated, modified LPDC encode module 323 can be designed to function with MAC I/F 210, PCS encode 221, scrambler 222 and 128 DSQ mapper 224. These modules need not be redefined. Of course, it should be noted, that small modifications can be made in various implementations.

In increasing a data transmission rate, modified LDPC encode module 323 can be designed to increase the number of data bits used to create the same 3584-bit LDPC encoded data block. Whereas unmodified LDPC encode module 223 is designed to use 3258 bits to create the 3584-bit LDPC encoded data block, modified LDPC encode module 323 can be designed to use greater than 3258 bits to create the same 3584-bit sized LDPC encoded data block.

As noted above, one example is to remove the error correction bits altogether. In this example, up to 325 extra data bits can be used by modified LDPC encode module 323 to produce the same 3584-bit sized LDPC encoded data block.

In general, the increase in the number of data bits used to generate a 3584-bit sized LDPC encoded data block can be offset by other changes in bit allocations for non-data functions. These non-data functions are not limited to parity and error correction bits. Using parity and error correction bits as an example, an increase in the number of data bits can be offset by changes in the numbers of parity and error correction bits. For example, an increase in 100 data bits can be offset by a decrease of 92 error correction bits and an increase in 8 parity bits. As would be appreciated, the specific changes in the changed allocation of bits to non-data functions would be implementation dependent as they would be targeted to particular design goals that balance data transmission rates with other considerations such as errors, latency, etc.

Figure 4:
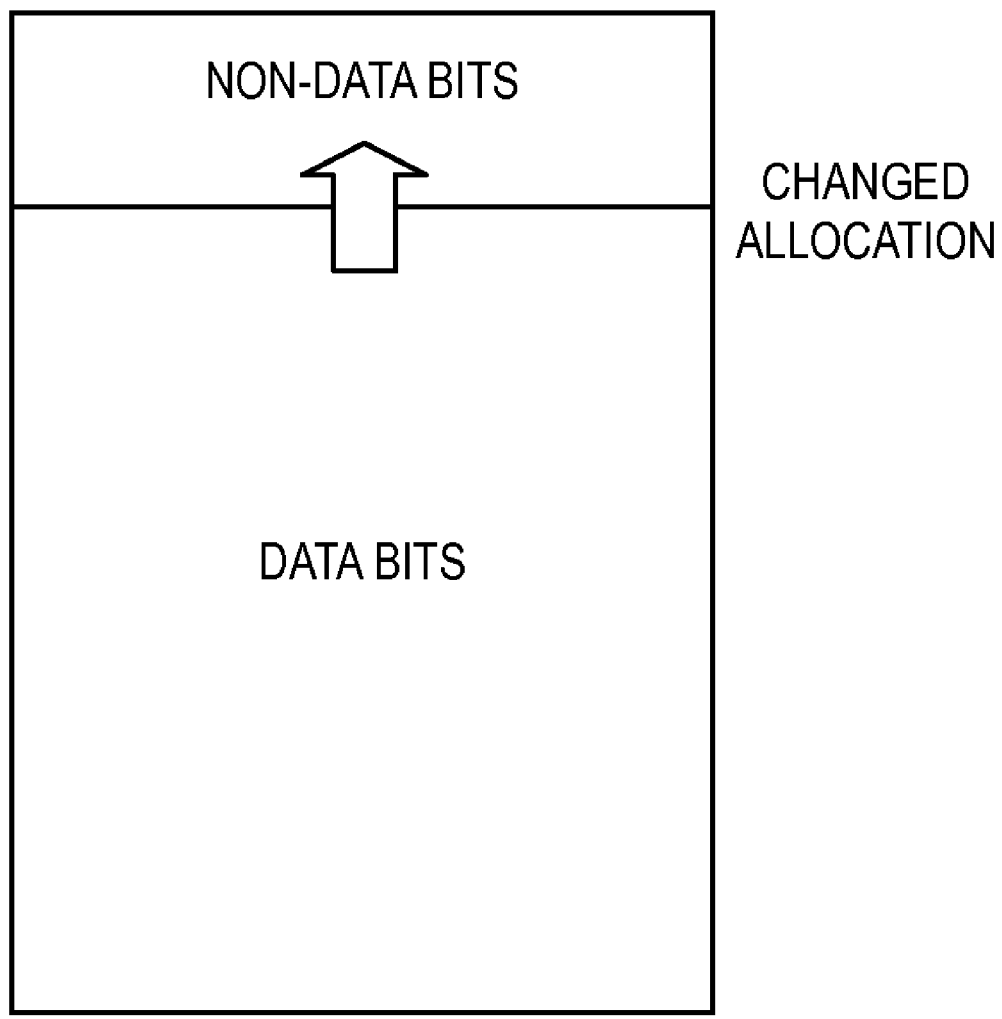
FIG. 4 illustrates an example of data bit and non-data bit allocation tradeoffs.

FIG. 4 illustrates such a tradeoff. As illustrated, modifications to an LDPC encoding can be represented by a changed relative allocation between data bits and non-data bits that are included in an LDPC encoded data block. The addition of extra data bits would be offset by a corresponding subtraction of non-data bits. The exact number and composition of such a subtraction would be implementation dependent.

The illustration of FIG. 4 also demonstrates the general notion that the increase of the transmission capacity can be gained through the reuse of any bits that are either unused or whose function can be sacrificed in view of the corresponding benefit. One potential example is framing bits. Another example is the use of bits in a control channel. These control channel bits can represent in-band or out-of-band channel bits that can be redirected to data use. In yet another example, reserved bits of the LDPC or other coding structure can be used for additional data bandwidth. While gains in additional data bandwidth would be modest, the gain in additional data bandwidth would not require a change in the underlying structure.

As has been described, building-block reuse can be promoted through the selective use of clocking rate increase, increase in coding efficiency, and bit reuse. In an additional embodiment, data bandwidth can also be increased through a modest increase in the number of voltage levels used. In various embodiments, these techniques can be used alone or in combination to generate a transmission rate that facilitates the marginal increase in bandwidth needs.

In one embodiment, the transmission rate can be a variable rate. For example, each PHY can test the channel and exchange information regarding the channel properties (e.g., type of cable, length of cable, bundling constraints, etc.) discovered by the channel diagnostics. This information can then be used to select the particular combination of clocking rate increase, increase in coding efficiency, and bit reuse to facilitate the bandwidth needs relative to the particular channel.

As would be appreciated, the principles of the present invention can be applied asymmetrically to a link. This can lead to different combinations of clocking rate increase, increase in coding efficiency, and bit reuse depending on the needs for each direction of a particular link.

The principles of the present invention can also be applied to various applications and would not be limited to the transmission of an uncompressed 1080P HDTV signal. For example, the principles of the present invention can be used in any audio or video distribution (e.g., home, enterprise, video enabled IP telephony, automotive, aircraft, etc.) and for lower rates (e.g., standard definition) that need slightly more bandwidth for increased resolution/quality.

More generally, any application that can use slightly more bandwidth can benefit from the principles of the present invention. This is often the case where a tradeoff between compression and bandwidth exists. Of course, the principles of the present invention do not preclude the complementary use of a selected compression along with a selected rate. An additional application that can benefit from the present invention is the downlinks from a TOR (top of rack) switch in a data center to servers in a datacenter application.

It should also be noted that the principles of the present invention are not to be construed to be limited to the 10G example of FIG. 2. More generally, the principles of the present invention can be applied to any existing architecture, including, 10 Mbit/s, 100 Mbit/s, 1 Gbit/s, 10 Gbit/s (e.g., 10GBASE-KR, KX4, CR1), 40 Gbit/s (e.g., 40GBASE-CR4), 100 Gbit/s (e.g., 100GBASE-CR10), etc. systems. In that regard, the principles of the present invention can also be applied to various standard, non-standard (e.g., 2.5 Gbit/s, 5 Gbit/s, 20-30 Gbit/s, etc.), or future (e.g., 40 Gbit/s, 100 Gbit/s, greater than 100 Gbit/s, etc.) link rate systems. The principles of the present invention can also be applied to shared media links like passive optical networks (PONs).

In one embodiment, the PHY can implement distinct configurations for multiple speeds. For example, the PHY can have one configuration for a 1G enhanced rate and a second configuration for a 10G enhanced rate.

It should also be noted that the principles of the present invention can be applied to various PHY applications including twisted pair, backplane, optical (e.g., small form-factor pluggable plus (SFP+)), point-to-multipoint, etc. Also, the principles of the present invention can be used in conjunction with energy efficient Ethernet networks and power over Ethernet networks.

These and other aspects of the present invention will become apparent to those skilled in the art by a review of the preceding detailed description. Although a number of salient features of the present invention have been described above, the invention is capable of other embodiments and of being practiced and carried out in various ways that would be apparent to one of ordinary skill in the art after reading the disclosed invention, therefore the above description should not be considered to be exclusive of these other embodiments. Also, it is to be understood that the phraseology and terminology employed herein are for the purposes of description and should not be regarded as limiting.

What is claimed is:

1. A method for increasing a data rate in a physical layer device, said physical layer device having a data transmission rate of X bits/s when transmitting symbols based on a low density parity check encoded data block of L bits that is generated by a low density parity check encoding module that encodes a block of N data bits with M error correction bits, said physical layer device having a clocking rate, the method comprising:
   receiving a stream of N+Y data bits in a modified version of said low density parity check encoding module, Y>0;
   generating, by said modified low density parity check module, a second low density parity check encoded data block of L bits, said second low density parity check encoded data block of L bits being generated using said received stream of N+Y data bits and M−Z error correction bits, Z>0; and
   transmitting, by said physical layer device, symbols based on said second low density parity check encoded data block of L bits using said clocking rate, wherein said transmission has a data transmission rate greater than X bits/s.

2. The method of claim 1, wherein Y is equal to Z.

3. The method of claim 1, wherein M is equal to Z.

4. The method of claim 1, wherein Y is not equal to Z.

5. The method of claim 4, wherein said generating comprises generating said second low density parity check encoded data block of L bits using an increased number of parity bits as compared to said low density parity check encoding module that encodes a block of N data bits with M error correction bits.

6. The method of claim 1, wherein X is 10G.

7. A method for increasing a data rate in a physical layer device that transmits symbols based on L-bit sized low density parity check encoded data blocks at a standardized data transmission rate of X bits/s at a clocking rate, the method comprising:
   increasing a number of data bits used to produce a redefined low density parity check encoded data block of L bits; and
   decreasing a number of error correction bits used to produce said redefined low density parity check encoded data block of L bits, said decrease of said number of error correction bits offsetting said increase of said number of data bits such that transmission of symbols based on said redefined low density parity check encoded data block of L bits is at a non-standardized data transmission rate of Y bits/s, Y>X.

8. The method of claim 7, wherein said decreasing comprises decreasing said number of error correction bits by a same amount as said increase of said number of data bits.

9. The method of claim 7, wherein said decreasing comprises decreasing said number of error correction bits by a different amount as said increase of said number of data bits.

10. The method of claim 9, further comprising increasing a number of parity bits used to produce said redefined low density parity check encoded data block of L bits.

11. The method of claim 7, further comprising increasing said clocking rate of said physical layer device.

12. The method of claim 7, further comprising increasing a number of voltage levels of said physical layer device.

13. The method of claim 7, wherein X is 10G.

14. A method for increasing a data rate in a physical layer device having a symbol mapper module that maps an L-bit sized low density parity check encoded data block produced by a low density parity check encoding module to symbols using a constellation, said physical layer device having a standardized data transmission of X bits/s when using said symbol mapper module in combination with said low density parity check encoding module, the method comprising:
   modifying said low density parity check encoding module, said modified low density parity check encoding module using an increased number of data bits and a decreased number of error correction bits to produce said L-bit sized low density parity check encoded data block; and coupling said modified low density parity check encoding module to said symbol mapper module, said coupling in a physical layer device enabling a non-standardized data transmission of Y bits/s, Y>X.

15. The method of claim 14, wherein X is 10G.

16. The method of claim 14, wherein said increased number of data bits is the same number as said decreased number of error correction bits.

17. The method of claim 14, wherein said increased number of data bits is not the same number as said decreased number of error correction bits.

18. The method of claim 14, wherein a total of said increased number of data bits and an increased number of parity bits is the same number as said decreased number of error correction bits.

19. The method of claim 14, wherein said decreased number of error correction bits is zero.

* * * * *